(12) United States Patent
Gogmos et al.

(10) Patent No.: US 12,471,187 B2
(45) Date of Patent: Nov. 11, 2025

(54) ELECTRONIC INTERFACE HOUSING FOR CONTROLLING AN ELECTRICAL HEATING DEVICE

(71) Applicant: Valeo Systemes Thermiques, Le Mesnil Saint-Denis (FR)

(72) Inventors: Erwan Gogmos, Le Mesnil Saint-Denis (FR); Yann Couapel, Le Mesnil Saint-Denis (FR); Jonathan Lefloch, Le Mesnil Saint-Denis (FR)

(73) Assignee: Valeo Systemes Thermiques, Le Mesnil Saint-Denis (FR)

( * ) Notice: Subject to any disclaimer, the term of this patent is extended or adjusted under 35 U.S.C. 154(b) by 901 days.

(21) Appl. No.: 17/762,890

(22) PCT Filed: Sep. 22, 2020

(86) PCT No.: PCT/FR2020/051643
§ 371 (c)(1),
(2) Date: Mar. 23, 2022

(87) PCT Pub. No.: WO2021/058900
PCT Pub. Date: Apr. 1, 2021

(65) Prior Publication Data
US 2022/0346194 A1 Oct. 27, 2022

(30) Foreign Application Priority Data
Sep. 27, 2019 (FR) .................................. 1910720

(51) Int. Cl.
*H05B 3/06* (2006.01)
*F24H 3/04* (2022.01)
(Continued)

(52) U.S. Cl.
CPC ................. *H05B 3/06* (2013.01); *H05B 3/03* (2013.01); *H05K 1/0212* (2013.01);
(Continued)

(58) Field of Classification Search
CPC ........ H05B 3/06; H05B 3/03; H05B 2203/02; H05B 2203/023; H05K 1/0212;
(Continued)

(56) References Cited

U.S. PATENT DOCUMENTS 9,224,547 B2 * 12/2015 Martinez Vite .......... H01H 9/02
2002/0076858 A1 * 6/2002 Dotta .................. H01L 23/3121
257/E23.125
(Continued)

FOREIGN PATENT DOCUMENTS

CN 1749054 A 3/2006
CN 101284489 A 10/2008
(Continued)

OTHER PUBLICATIONS

Office Action Issued in Corresponding CN Application No. 202080066805.X, dated Jan. 17, 2024. (9 Pages).

*Primary Examiner* — Elizabeth M Kerr
*Assistant Examiner* — Keith Brian Assante
(74) *Attorney, Agent, or Firm* — Osha Bergman Watanabe & Burton LLP

(57) ABSTRACT

The invention relates to an electronic interface housing (6) of an electrical heating device (1) for heating an airflow passing through, the electronic interface housing (6) being configured to house electronic components for controlling at least one heating element (4) fitted to the electrical heating device (1), including at least one printed circuit board (44), the electronic interface housing (6) comprising at least one rib (56, 58) in contact with the printed circuit board (44) in a contact zone (54), characterized in that the printed circuit board (44) comprises at least one water drainage opening (82) in the contact zone (54).

10 Claims, 3 Drawing Sheets

(51) Int. Cl.
*H05B 3/03* (2006.01)
*H05K 1/02* (2006.01)
*H05K 5/02* (2006.01)

(52) U.S. Cl.
CPC ......... *H05K 5/0213* (2013.01); *H05K 5/0217* (2013.01); *F24H 3/0429* (2013.01); *F24H 3/0452* (2013.01); *H05B 2203/02* (2013.01); *H05B 2203/023* (2013.01)

(58) Field of Classification Search
CPC .. H05K 5/0213; H05K 5/0217; F24H 3/0429; F24H 3/0452
See application file for complete search history.

(56) References Cited

U.S. PATENT DOCUMENTS

| | | | |
|---|---|---|---|
| 2017/0339801 A1* | 11/2017 | Sasaki | H05K 7/20 |
| 2018/0022192 A1 | 1/2018 | Maeda | |
| 2021/0104879 A1* | 4/2021 | Kobayashi | H02G 3/16 |
| 2024/0023290 A1* | 1/2024 | Qi | H01M 10/613 |

FOREIGN PATENT DOCUMENTS

| | | |
|---|---|---|
| CN | 102997345 A | 3/2013 |
| CN | 104658781 A | 5/2015 |
| CN | 107710867 A | 2/2018 |
| CN | 207772832 U | 8/2018 |
| DE | 102009032621 A1 | 1/2010 |
| EP | 3310127 A1 | 4/2018 |

* cited by examiner

ELECTRONIC INTERFACE HOUSING FOR CONTROLLING AN ELECTRICAL HEATING DEVICE

The field of the present invention is that of motor vehicle heating. The invention relates to the electrical heating devices intended to be mounted in a ventilation, heating and/or air conditioning system of a motor vehicle.

More particularly, the invention relates to an electrical heating device comprising heating elements for diffusing heat under the effect of an electrical potential, that is to say resistive heating elements, for example positive temperature coefficient (PTC) resistors, which make it possible to rapidly produce heat in vehicles by way of a given electrical power supply.

The employment of such electrical heating devices for heating an airflow passing in particular through a duct of a ventilation, heating and/or air-conditioning system of a motor vehicle is known. In this context, electrical heating devices, or electrical heaters, comprise an open-worked frame configured to carry heating modules that heat by way of heat diffusion under the effect of an electrical potential, such that these heating modules are in contact with an airflow passing through the frame. Such a frame contains, for example, compartments making it possible to receive at least one heating module which extends longitudinally and which can be formed of a tube inside which there are housed electrodes which surround the resistive heating elements. On the outside of the tube, the electrodes are continued by connecting terminals that extend to connection terminals, which are themselves connected to a printed circuit board. The connection terminals, the printed circuit board and the other electronic components necessary for the operation of the electrical heating device are integrated in an electronic interface housing which comprises a base forming a space for receiving these components and a cover which covers the base to protect them.

The development of the technologies and thermal needs of vehicles involves the implementation of electrical heating devices supplied with high voltage, so as to deliver, by the resistive elements, a thermal power able to heat the air passing through the ventilation, heating and/or air conditioning system without the need to add an additional heat exchanger. These high-voltage devices require more and larger electronic components, and this is accompanied by a need for a bulky electronic interface housing to house these components. The fact of having a bulky electronic interface housing implies the fact of having a cover with a large surface area, which makes it possible to bend the cover at its center, at a distance from means for fixing this cover on the base, in particular by elastic click and ratchet. It is therefore known to provide, between the cover and the printed circuit board, rigid ribs which extend in such a way as to be in contact with one another, between the electronic components fixed to this printed circuit board, in order to reduce the risk of deformations of the cover. The rigid ribs thus act as supports for the cover on the printed circuit board, thus preventing the cover from deforming, under certain stresses.

In addition, once the cover is fixed to the base, the printed circuit board and the electronic components are housed in a space that is substantially enclosed, delimited by the base and the cover. The number of electronic components in the electronic interface housing leads to a significant heat input and an increase in the temperature inside the cover, this phenomenon being increased by the high-voltage power supply mentioned above. In order to allow the cooling of the electronic components, the cover and/or the base are pierced with openings, equipped with filtering membranes, to allow the passage of air and the evacuation of calories. On the other hand, cool moist air enters the housing and the heat from the components can cause the moist air to condense and form drips on the inner face of the cover.

Drip runoff can occur along the rigid ribs from the contact zone of these ribs with the cover to the contact zone of these ribs with the printed circuit board. It is understood that the presence of water on the printed circuit board, which is also equipped with electronic components, can lead to short circuits or at least to damage to the components.

In this context, it is the object of the present invention to propose an electronic interface housing for a heating device that makes it possible to prevent significant bending of the cover while preventing water accumulation on the printed circuit board.

To this end, the present invention firstly relates to an electronic interface housing of an electrical heating device for heating an airflow passing through it, the electronic interface housing being configured to house electronic components for controlling at least one heating, element fitted to the electrical heating device, including at least one printed circuit board, the electronic interface housing comprising at least one rib in contact with the printed circuit board in a contact zone, characterized in that the printed circuit board comprises at least one water drainage opening in the contact zone.

The electrical heating device comprises two blocks that are integral with one another, each block having its own function. A block is formed by heating elements and its main function is to reheat the air passing through it when the heating device is turned on. The other block comprises the electronic interface housing ensuring the electrical control and energy supply of the electrical heating device.

The electronic interface housing is dimensioned to house the electronic components required to control the heating device. One of the main elements of the electronic components is the printed circuit board, which has the function of connecting all the electronic components of the electrical heating device to one another, or at least to an electrical network of the vehicle, such as a connecting element of a heating element.

The printed circuit board is thus housed in the electronic interface housing, being formed integrally, particularly at its periphery, with a wall of this housing. The presence of a rib forming a projection of the housing and extending to the printed circuit board makes this assembly more rigid.

The feature of the invention according to which the printed circuit board comprises at least one water drainage opening at the contact zone between the printed circuit board and the rib makes it possible to ensure the drainage of water stagnating along this rib of the cover at the contact zone with the printed circuit board and thus makes it possible to prevent short-circuiting of the electronic components carried by the printed circuit board and/or oxidation of these components.

According to an optional feature of the invention, the water discharge opening is dimensioned to protrude from the contact zone.

The diameter, or one of the dimensions, of the water discharge opening is larger than the corresponding dimension, for example the thickness, of the rib at the contact zone. This means that the water drainage opening is not completely covered by the rib and liquid can pass through it to be drained from this contact zone between rib and printed circuit board.

According to an optional feature of the invention, the water drainage opening opens out on each side of the printed circuit board.

It is understood that the water drainage opening passes through the printed circuit board at the contact zone.

According to another optional feature of the invention, each contact zone of the printed circuit board comprises at least one water drainage opening. In this way, it is possible to avoid the accumulation of water on each of the ribs in contact with these contact zones.

According to an optional feature of the invention, the printed circuit board has at least one guiding opening at the contact zone and the water discharge opening is separate from said guiding opening.

The guiding opening thus provided at the contact zone is configured to accommodate a guiding pin of one of the ribs of the cover and/or of the base of the electronic interface housing. This guiding opening makes it possible to position the cover and/or base and the printed circuit board correctly when mounting the heating device.

It is understood that the water drainage opening and the guiding opening are located on the printed circuit board at the contact zone, and are thus close to one another. However, the water discharge opening and the guiding opening are not common, as one does not assure the function of the other, and are therefore separate from one another. More particularly, the water discharge opening according to the invention is specifically designed for this function and is not intended to receive a guiding pin which could hinder the discharge of water.

According to an optional feature of the invention, the size of the water discharge opening smaller than the corresponding size of the guiding opening.

As described above, the water drainage opening is only intended for this water drainage and is therefore dimensioned to be as small as possible so that the liquid can pass through the printed circuit board, while the guiding opening must be large enough to receive a guiding pin that is integral with the rib forming the contact zone.

According to an optional feature of the invention, the drainage opening is located more centrally on the printed circuit board than the guiding opening. The aim is thus to discharge primarily the part of the liquid stagnating in the contact zone that is closest to the center and thus to the electronic components arranged heavily in the center of the printed circuit board.

According to an optional feature of the invention, the printed circuit board comprises a first guiding opening and a first water discharge opening in alignment along a first alignment axis, and at least one second guiding opening and at least one second water discharge opening in alignment along a second alignment axis, characterized in that the first alignment axis and the second alignment axis are perpendicular to one another in the plane of extension of the printed circuit board.

It is understood that each assembly formed by a discharge opening and a guiding opening is geometrically configured, in alignment with the openings, according to the orientation of the rib forming the contact zone. It is advantageous to have two ribs in contact with the printed circuit hoard which are arranged at a distance from one another and are oriented in perpendicular directions, and therefore an assembly formed by a discharge opening and a guiding opening advantageously has an orientation, that is to say an alignment axis, substantially perpendicular to the orientation of another assembly.

According to an optional feature of the invention, the electronic interface housing comprises a base and a cover, with the rib projecting from the base and/or the cover.

The rib can in particular form a projection from the cover, and can help to stiffen this element having the form of a substantially flat plate. In particular, the cover may be configured to have a peripheral portion for fixing to the base and a central part for covering the electronic components of the housing housed in the base, and the rib for contacting the printed circuit board starts from the central part of the cover.

According to an optional feature of the invention, the water discharge opening is arranged opposite the distal end of a first rib starting from the cover and opposite the distal end of a second rib starting from the base.

The invention also relates to a heating device comprising at least one heating element and an electronic interface housing according to any one of the aforementioned features.

Further features, details and advantages of the invention will become more clearly apparent from reading the following description, and also from a number of exemplary embodiments given by way of non-limiting indication, with reference to the appended schematic drawings, in which.

The features, variants and different embodiments of the invention may be combined with one another, in various combinations, as long as they are not mutually incompatible or mutually exclusive. In particular, variants of the invention can be contemplated that only comprise a selection of features that are described hereafter independently of the other described features, if this selection of features is sufficient to provide a technical advantage and/or to differentiate the invention from the prior art.

Figure 1:
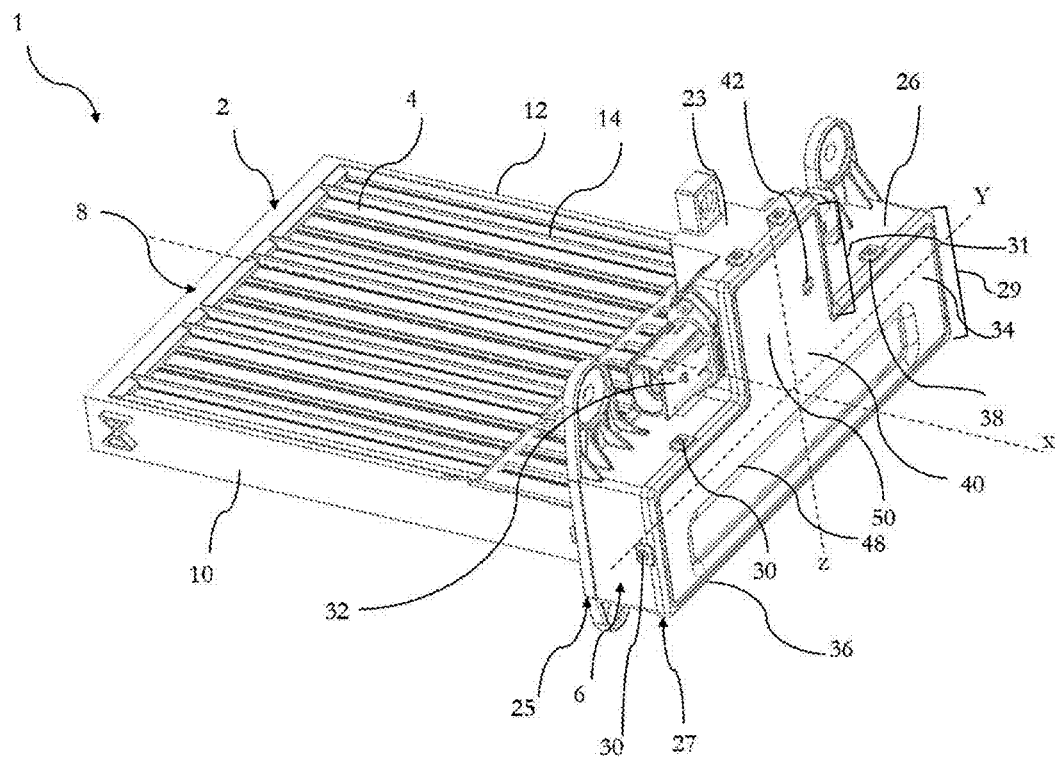
FIG. 1 shows a perspective view of a heating device according to the invention.

Referring first to FIG. 1, an electrical heating device 1 according to the invention comprises a heating body 2 having at least one heating element 4, and an electronic interface housing 6 formed integrally with the heating body 2.

The electrical heating device 1 is configured to be integrated in a housing of a ventilation, heating and/or air conditioning system. More particularly, the electrical heating device is integrated in such a system, with the heating body 2 arranged inside the system, across a duct for circulating an airflow, and with the electronic interface housing accessible from outside the housing of this system. The heating element(s) 4 present in the heating body make it possible to heat the air passing through the electrical heating device 1. The electronic interface housing 6 contains all the electronic components that make it possible both to control the operation and the electrical power supply of the heating device 1.

The heating body 2 here comprises a frame forming a structure for holding the heating elements. It should be noted that the presence of a frame is not necessary according to the invention and that what follows with regard to the frame is described only by way of illustration, it being understood that the heating body 2 could consist of heating elements connected to the electronic interface housing 6 and not supported by a frame.

Here, the frame is of a monobloc design, formed in one piece, and has the form of a rectangular parallelepiped extending primarily along a longitudinal axis X. More particularly, the frame comprises a bottom wall 8 that extends opposite the electronic interface housing 6 with respect to the at least one heating element 4 when the electrical heating device 1 is assembled. Positioned at each of the transverse ends of the bottom wall 8 are a first side wall 10 and a second side wall 12, which extend perpendicularly to the bottom wall 8. The first side wall 10 and the second side wall 12, arranged opposite one another, help to transversely delimit the housing formed by the frame of the electrical heating device 1.

The assembly formed by the bottom wall 8, the first side wall 10 and the second side wall 12 is U-shaped, where the bottom wall 8 forms the base of the U, the electronic interface housing 6 closing the opening of the U during the assembly of the electrical heating device 1.

This configuration results in the presence of two open-worked faces, delimited by the bottom wall, the side walls and the electronic interface housing, and able to be traversed by the airflow when the heating body 2 is arranged in the ventilation, heating and/or air conditioning system housing. The frame, here present in the heating body 2, has a plurality of longitudinal bars 14 that extend across the open-worked faces, parallel to the first side wall 10 and the second side wall 12.

The bottom wall 8, the first side wall 10, the second side wall 12 and the plurality of longitudinal bars 14 help to form at least one space in which at least one heating element 4, as described above, is positioned.

The at least one heating element 4 comprises resistive elements that are electrically powered so as to heat and thus help in reheating the airflow passing through the electrical heating device 1. Thus, the at least one heating element 4 is electrically connected to a vehicle electrical network via the electronic interface housing 6.

The at least one heating element 4 extends along a longitudinal axis of the electrical heating device 1, parallel to the first side wall 10 and the second side wall 12.

The electronic interface housing 6 comprises a base 26 and a cover 34. The base is configured to house electronic components and the associated printed circuit board, and the cover 34 is arranged to cover the base 26 to protect these components from the weather and impact, for example. The base 26 and the cover 34 of the electronic interlace housing 6 thus contribute to the housing and protection of the electronic components of the electronic interface housing 6.

The base 26 has an inner face, not visible in FIG. 1 and facing the inside of the electronic interface housing 6 and the electronic components, and an outer face 23.

The base 26 has a proximal longitudinal part 25 close to the heating body 2, capable of cooperating with the heating body 2 to allow the assembly of one with the other, and a distal longitudinal part 27, which is distant from the heating body 2 and on which the cover 34 is fixed.

In the illustrated example, the base 26 has a T-shape with a first part 29 extending transversely across substantially the entire transverse dimension of the heating body and a second part 31 extending vertically from the first part 29 substantially at its center. The first part 29 is located in the longitudinal extension of the heating body 2 and helps to house the electrical connection means of the heating elements present in this heating body, while the second part 31 is vertically offset with respect to the first part 29 and the heating body.

On the second part 31 of the base 26 there is positioned at least one electrical connection socket 32 making it possible to supply electrical current, in particular at high voltage, to the electronic components of the electronic interface housing 6 and the resistive elements of each of the heating elements.

The base 26 comprises on its outer face 23 and on its distal longitudinal part 27 at least one lug 30. The at least one lug 30 is dimensioned to cooperate with means for fixing specific to the cover 34 in order to ensure the reversible fixing of the cover on the base 26.

The cover 34 takes the form of a plate that covers the base 26, in particular to protect the electronic components housed in the base 26. To this end, the cover 34 has a shape, here in the form of a T, complementary to the shape of the base 26. More particularly, in the illustrated example, the cover 34 has a first portion 48, having a shape and dimensions equivalent to those of the first part 29 of the base 26, and a second portion 50, having a shape and dimensions equivalent to those of the second part 31 of the base 26.

The cover 34 extends primarily in a plane having a transverse axis Y and a vertical axis Z. Furthermore, it is arbitrarily defined that the cover 34 is at the front of the electrical heating device 1 along the longitudinal axis X and that the bottom wall 8 is at the rear of the electrical heating device 1 along this longitudinal axis X.

The cover 34 has a peripheral portion 36, intended to cooperate with a complementary peripheral edge of the base for fixing the cover to the base, and a central part 40 for covering the base. The peripheral portion 36 has at least one tab 38 which extends perpendicularly to the plane of the cover and of which the function is to fix the cover 34 to the base 26 by complementing the previously mentioned lug or lugs 30. It is understood that the lugs 30 and the tabs 38 cooperate here to form click and ratchet means by elastic deformation.

On the central part 40, here at the second portion 50, the cover comprises a ventilation opening 42, which allows the cooling of the electronic components integrated in the electronic interface housing 6 and prevents their overheating.

Figure 2:
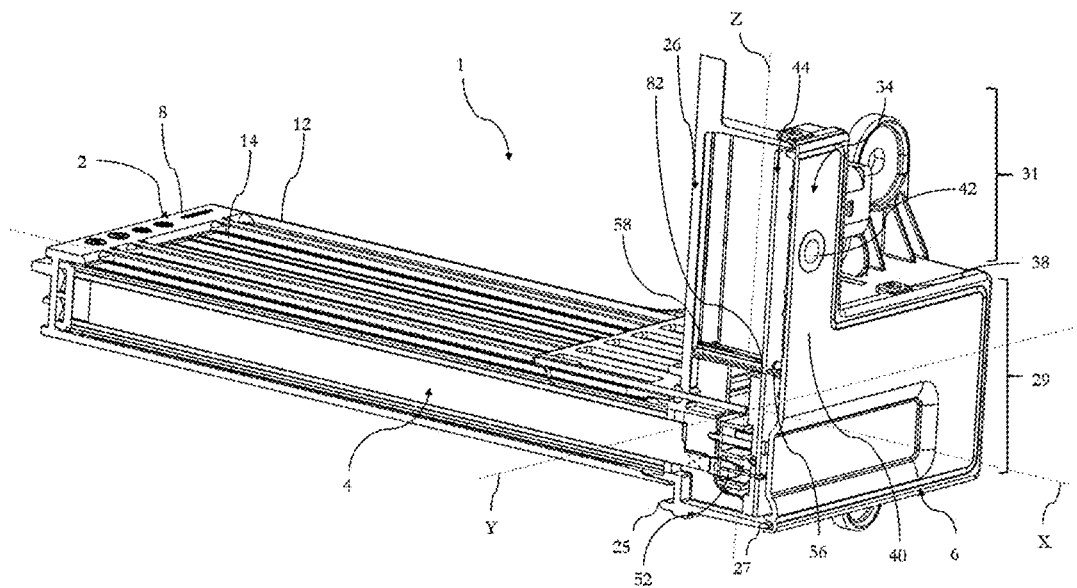
FIG. 2 is a longitudinal section of the perspective view of the heating device of FIG. 1, in which in particular the printed circuit board fitted to the heating device, a rigid rib of the cover and a rigid rib of the base enclosing this printed circuit board, and a water drainage opening formed in the printed circuit board in line with the rigid rib of the cover have been made visible.

As shown to FIG. 2, the base 26 and the cover 34 house various electronic components including a printed circuit board 44. The printed circuit board 44 has a rear side 51, facing the heating body 2, and a front side 53, facing the cover 34, these front and rear sides being thus defined according to the arbitrarily chosen reference system. The printed circuit board 44 carries a plurality of electronic components and incorporates copper tracks for supplying power and sending control instructions to these components, here not visible, the printed circuit board thus providing electronic control of the heating elements of the electrical heating device according to the invention.

In particular, the printed circuit board 44 is configured to be made integral with at least one connecting element 52 integral with a heating element 4, so as to ensure the electrical connection necessary for the passage of current in order for this heating element 4 to produce heat.

The front face 53 of the printed circuit board 44 contacts at least a first rigid rib 56 starting from the cover 34 at a first contact zone 54. The first rigid rib 56 extends longitudinally, substantially perpendicularly to the plane of the cover 34. In the illustrated example, the first rigid rib 56 extends primarily longitudinally along the longitudinal axis X and transversely along the transverse axis Y.

The first rigid rib 56 has a first distal end 57, or in other words a free end remote from the cover from which it projects, the first rigid rib 56 contacting the printed circuit board 44 at this first distal end 57 in order to form the first contact zone 54 previously mentioned.

In the illustrated example, in this first contact zone 54, the rear side 51 of the printed circuit board 44 contacts at least a second rigid rib 58 starting from the base 26. As described for the first rigid rib 56, the second rigid rib 58 extends longitudinally, substantially perpendicularly to the plane defined by the bottom of the base 26. In the illustrated example, the second rigid rib 58 extends primarily longitudinally along the longitudinal axis X and transversely along the transverse axis Y.

The second rigid rib 58 has a second distal end 60, or in other words a free end remote from the bottom of the base from which it projects, the second rigid rib 58 contacting the printed circuit board 44 at this second distal end 60.

The first rib 56 of the cover 34 and the second rib 58 of the base 26 are thus located on either side of the printed circuit board 44 at the first contact zone 54 and are arranged to enclose the printed circuit board. The first rib 56 of the cover 34 is identically oriented with the second rib 58 of the base 26, particularly here along the transverse axis Y. The first rib 56 of the cover 34 and the second rib 58 of the base 26 enclose the printed circuit board 44, preventing displacement of the printed circuit board 44 along the longitudinal axis X. Cross-sections of the first rigid rib 56 and the second rigid rib 58 are shown as hatched areas throughout FIGS. 2, 4 and 5.

Independently of this sandwiching of the printed circuit board between two rigid ribs, it should be noted that the first rib 56 of the cover 34 resting against the printed circuit board avoids the bending of the cover at its center, by a take-up of forces on the printed circuit board, which is more rigid than the cover and moreover firmly fixed in the base.

Figures 3, 4:
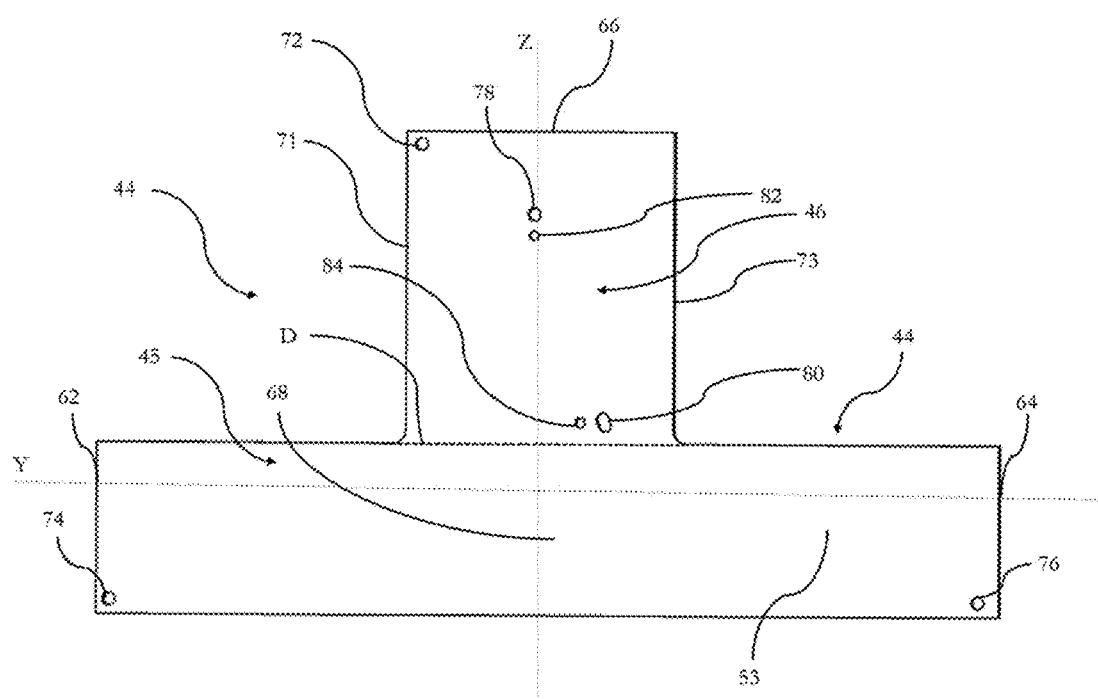
FIG. 3 is a schematic representation of the printed circuit board, here without electronic components, comprising two water discharge openings arranged next to a guiding opening each.
FIG. 4 is a partial representation, according to a cross-sectional view, of the electronic interface housing of the heating; device of FIG. 1, said cross-section being made in a plane comprising a rigid rib of the cover and a rigid rib of the base and making visible a water discharge opening and a guiding opening.

As shown in FIG. 3, the printed circuit board 44 extends in a T-shape complementary to the shapes of the cover 34 and the base 26. The printed circuit board has a primary part 45 extending along the transverse axis Y, between a first transverse end edge 62 and a second transverse end edge 64, and a secondary part 46 which extends the primary part substantially at its center primarily in the vertical direction Z and which has a vertical end edge 66.

The secondary part 46 extends in the form of a rectangle having as sides, in addition to the junction edge D with the primary part 45, shown by way of a dotted line in FIG. 3, a first side edge 71, a second side edge 73 and the vertical end edge 66.

The printed circuit board 44 has a number of openings on the rear side 51 and/or on the front side 53, including fixing openings 72, 74, 76, guiding openings 78, 80 and water drainage openings 82, 84.

More particularly, the printed circuit board has at least a first fixing opening 72, a second fixing opening 74 and a third fixing opening 76, opening out on the rear face 51 and/or on the front face 53 and intended to be passed through by fixing elements, not shown, in order to make the printed circuit board 44 integral with the cover 34 and the base 26 of the electronic interface housing 6.

The first fixing opening 72, the second fixing opening 74 and a third fixing opening 76 are advantageously circular and of the same diameter.

The first fixing opening 72 is located on the secondary part 46 of the printed circuit board 44, here as shown at a corner formed by the vertical end edge 66 and a side edge 71 of the secondary part 46.

The second fixing opening 74 and the third fixing opening 76 are located on the primary part 45 of the printed circuit board 44, here at the junction of a transverse end edge 62, 64 and a vertical end edge opposite the first vertical end edge 66 of the secondary part 46.

According to the invention, the printed circuit board has at least one water drainage opening. More particularly, the printed circuit board 44, here at the secondary part 46, has at least one first guiding opening 78 and at least one first water discharge opening 82 disposed in the vicinity of this first guiding opening. In the described embodiment, the printed circuit board also comprises a second guiding opening 80 and a second water drainage opening 84, also arranged in the secondary part 46. It is understood from the following that each water discharge opening provided in accordance with the invention is associated with a guiding opening, that is to say arranged in the vicinity of this guiding opening, without this limiting the invention, since the printed circuit board is equipped with an opening, on the one hand, arranged near a rib starting from the cover and forming a contact zone between cover and printed circuit board, and, on the other hand, the sole function of which is to drain off the condensation water likely to stagnate on the printed circuit board after having flowed along this rib.

In the illustrated example, the first guiding opening 78 is circular in shape and has a first diameter. Advantageously, the first guiding opening 78 is centered between the side edges 71, 73 of the secondary part 46 of the printed circuit board 44, by being arranged vertically closer to the vertical end edge 66 than to the junction edge D. The first guiding opening 78 is configured, in shape and dimensions, to receive a guiding pin, visible in FIGS. 4 to 6 forming a projection from the second rigid rib 58 integral with the base 26.

The first water discharge opening 82 is also circular in shape and has a second diameter smaller than the first diameter of the first guiding opening 78. The first water discharge opening 82 is provided in the vicinity of the first guiding opening 78, here in alignment with the first guiding opening 78 along the vertical axis Z, corresponding, as will be described hereafter with reference to FIGS. 4 to 6, to the primary orientation of the first rigid rib 56. Specifically, the first water discharge opening 82 and the first guiding opening are aligned such that the first guiding opening is located further outside the printed circuit board, that is to say here closer to the vertical end edge 66, than the first water discharge opening 82. In other words, the first water discharge opening 82 takes a more central position than the first guiding opening 78.

The second guiding opening 80 is positioned on the other side of the secondary part 46 with respect to the first guiding opening, that is to say closer to the junction edge D than the transverse end edge 66. The second guiding opening is oblong in shape here, with a primary dimension defined by an axis passing substantially through the center of the first guiding opening and a secondary, smaller dimension perpendicular to this primary dimension. The second guiding opening 80 is here transversely offset, along the transverse axis Y, from the center of the secondary part 46. The second guiding opening is also intended to receive a guiding pin formed at the end of a rigid rib starting from the base 26.

The second water discharge opening 84 is circular and has a third diameter here smaller than the secondary dimension of the second guiding opening 80. Here, the second water discharge opening 84 is transversely aligned, along the transverse axis Y, with the second guiding opening 80. The second water discharge opening 84 is provided in the vicinity of the second guiding opening 80, being, as discussed for the first water discharge opening 82, closer to the center of the secondary part 46 than is the second guiding opening 80.

The first water discharge opening 82 and the second water discharge opening 84 are shown as speckled zones throughout FIGS. 2, 4, 5 and 6.

According to the invention, each water discharge opening is arranged in the contact zone formed by the contact of the first rigid rib starting from the cover with the printed circuit board. Moreover, this water drainage opening is dimensioned to allow water to pass through the printed circuit board, and thus to be only partially covered if necessary by the first rib in this contact zone.

Figure 5:
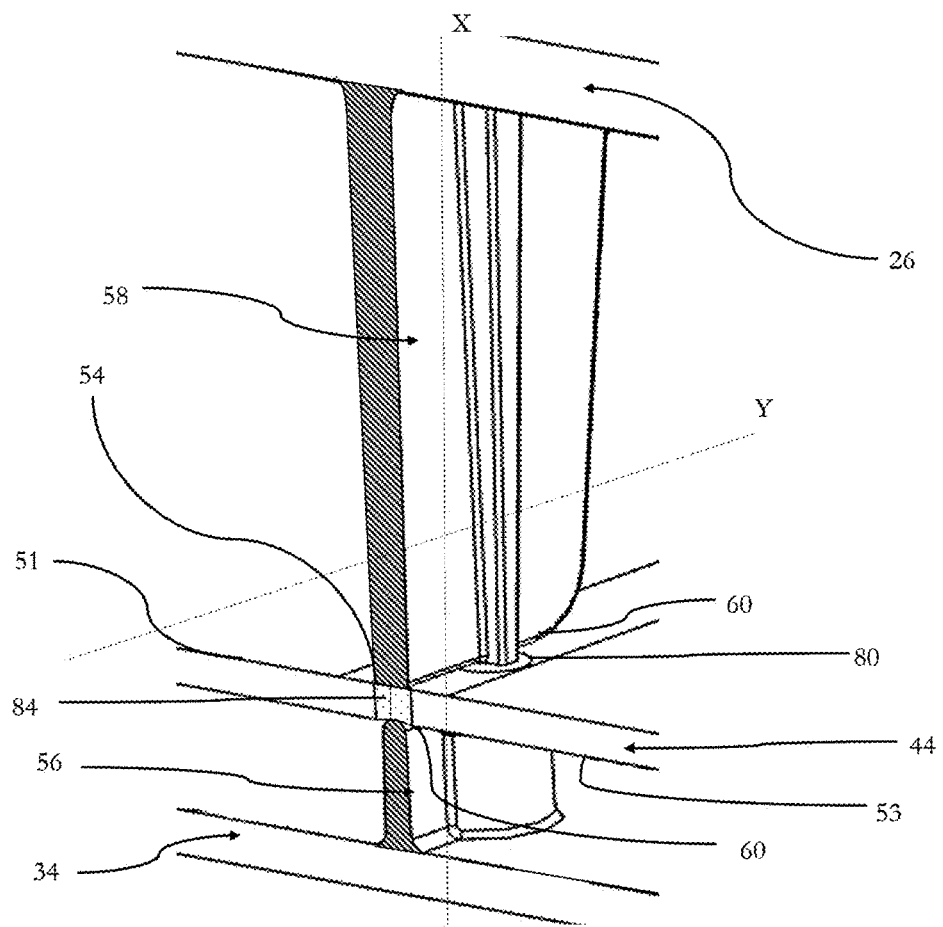
FIG. 5 is a perspective view of a longitudinal section of FIG. 4.

In the example described, and in particular illustrated in FIGS. 4 and 5, the second guiding opening 80 and the second water discharge opening 84 are positioned in the first contact zone 54 where the first rigid rib 56 of the cover 34 is in contact with the front face 53 of the printed circuit board 44. It should be noted that, in the illustrated embodiment and without limiting the invention, the second rigid rib 58 of the base 26 is in contact with the rear face 51 of the printed circuit board 44 also in this first contact zone, and that therefore the second water discharge opening 84 is arranged between the two rigid ribs.

The second rigid rib 58 has, at its second distal end 60, a guiding pin 86. The guiding pin 86 extends longitudinally along the longitudinal axis X, extending the second rigid rib 58 toward the front of the electrical heating device 1 according to the arbitrarily chosen reference system. The guiding pin 86 is intended to fit into the second guiding opening 80. The diameter measured at the base of the guiding pin 86 is smaller than the secondary dimension of the second guiding opening. In fact, when the electrical heating device 1 is mounted, the guiding pin 86 of the second rigid rib 58 of the base 26 is housed in the second guiding opening 80 of the printed circuit board for the purpose of correctly positioning the printed circuit board 44 in the electronic interface housing 6. The oblong shape of the second guiding opening 80 allows the guiding pin to slide in this opening along the main direction and thus allows the position of the printed circuit board to be adjusted relative to the base, and the circular shape of the first guiding opening 78 allows this adjusted position to be fixed.

As shown in FIG. 4, the longitudinal length of the guiding pin 86 is greater than the thickness of the printed circuit board 44, also measured along the longitudinal axis X, such that a free end 87 of the guiding pin 86 protrudes from the front face 53 of the printed circuit board 44.

As a reminder, the first rigid rib 56 of the cover 34 and the second rigid rib 58 of the base 26 are aligned with one another on either side of the printed circuit board. The first rigid rib 56 of the cover 34 has a recess 88 intended to provide sufficient space so as not to be in contact the free end 87. As a result, the first rigid rib 56 is not in contact with the first contact zone 54 at the second g siding opening 80.

At the water discharge opening, here the second water discharge opening 84, the first rigid rib 56 of the cover 34 and the second rigid rib 58 of the base 26 are in contact with the first contact zone 54 of the printed circuit board 44. The first rigid rib 56 covers a major part of the second water drainage opening 84 on the front face 53 of the printed circuit board 44. The second rigid rib 58 covers a major part of the second water drainage opening 84 on the rear side 51 of the printed circuit board 44.

As a result of the foregoing, the water drainage opening formed in the printed circuit board according to the invention is dimensioned so as not to be completely covered by either of the ribs, so as to allow water to pass therethrough in order to drain from the printed circuit board. In other words, and as illustrated in FIG. 5, the diameter of a water discharge opening according to the invention, here the third diameter of the second water discharge opening 84, is greater than the thickness of the corresponding rigid rib at its distal end in contact with the printed circuit board, here the thickness of the first rigid rib 56 at the first distal end 57. Moreover, if a second rigid rib is present on the other side of the printed circuit board, the diameter of the water discharge opening is then larger than the thickness of the second rigid rib at the second distal end. Thus, the water discharge opening, here the second water discharge opening 84, protrudes on both sides of the contact zone of the corresponding rigid rib with the printed circuit board, here on both sides of the first contact zone 54 of the first rigid rib 56 with the printed circuit board 44.

In this way, the second water drainage opening 84 prevents water from stagnating at the first contact zone 54 of the first rigid rib 56 and the second rigid rib 58 with the printed circuit board 44. More generally, each water drainage opening formed in the printed circuit board makes it possible to prevent water stagnation at the contact zone between the rigid rib starting from the cover and the printed circuit board.

The water that forms on the inner face of the cover, when the temperature inside the electronic interlace housing 6 increases and the hot air loaded with moisture comes into contact with the cover, which is subjected to the temperature of the outside air, flows along the rigid rib starting from the cover toward the contact zone of this rigid rib with the printed circuit board, and then through the water drain opening, driven by gravity.

It should be noted that everything just described in relation to the second water discharge opening and the corresponding ribs intended to be in contact with the printed circuit board in a contact zone in which this second water discharge opening extends also applies, without restriction, to the first water discharge opening in its own contact zone.

The invention as just described makes it possible to solve the technical problems discussed above, namely to provide an electrical heating device in which the cover is less subject to deformations due to the presence of a rigid rib between the cover and a printed circuit board housed in the electronic interface housing, and in which the presence of this rigid rib does not result in water stagnation along the printed circuit board against this rib.

It should be noted that in what has been described above, the water discharge opening is provided in the printed circuit hoard in a contact zone formed by the contact of this printed circuit board with a rigid rib preferably from the cover, this being particularly beneficial when the cover is in a position overhanging the printed circuit board when the electrical heating device is arranged in the ventilation, heating and/or air conditioning system housing, and that the water drops due to condensation tend to be directed from the cover to the base under the effect of gravity. It is understood that, without departing from the context of the invention, the drainage opening could be formed in the printed circuit board in a contact zone formed by the contact of this printed circuit board with a rigid rib starting from the base, without being opposite a rigid rib starting from the cover, if it is the base which is in a position overhanging the printed circuit board when the electrical heating device is arranged in the ventilation, heating and/or air conditioning system housing, and that the drops of water due to condensation tend to be directed from the base to the cover under the effect of gravity.

The invention claimed is:

1. An electronic interface housing of an electrical heating device for heating an airflow passing through, the electronic interface housing being configured to house electronic components for controlling at least one heating element fitted to the electrical heating device, the electronic interface housing comprising:
    at least one printed circuit board; and
    at least one rib in contact with the printed circuit board in a contact zone,
    wherein the printed circuit board comprises at least one water drainage opening in the contact zone and at least one guiding opening at the contact zone, wherein the water discharge opening is separate from said guiding opening.

2. The electronic interface housing of claim 1, wherein the water drainage opening is dimensioned to protrude from the contact zone.

3. The electronic interface housing of claim 1, wherein the water drainage opening opens out on each side of the printed circuit board.

4. The electronic interface housing of claim 1, wherein each contact zone of the printed circuit board has at least one water discharge opening.

5. The electronic interface housing of claim 1, wherein the size of the water drainage opening is smaller than the corresponding size of the guiding opening.

6. The electronic interface housing of claim 1, wherein the drainage opening is located more centrally on the printed circuit board than the guiding opening.

7. The electronic interface housing of claim 1, wherein the printed circuit board comprises a first guiding opening and a first water discharge opening in alignment along a first alignment axis, and at least one second guiding opening and at least one second water discharge opening in alignment along a second alignment axis, characterized in that the first alignment axis and the second alignment axis are perpendicular to one another in the plane of extension of the printed circuit board.

8. The electronic interface housing of claim 1 further comprising a base and a cover, said rib forming a projection from the base and/or the cover.

9. The electronic interface housing of claim 8, wherein the water discharge opening is arranged opposite the distal end of a first rib starting from the cover and opposite the distal end of a second rib starting from the base.

10. An electrical heating device comprising at least one heating element and an electronic interface housing of claim 1.

* * * * *